(12) United States Patent
Hida et al.

(10) Patent No.: US 7,342,348 B2
(45) Date of Patent: Mar. 11, 2008

(54) MICRO DISPLACEMENT MECHANISM AND MAGNETIC DISK APPARATUS

(75) Inventors: Masaharu Hida, Kawasaki (JP);
Shigeyoshi Umemiya, Kawasaki (JP);
Masao Kondo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/521,050

(22) Filed: Sep. 14, 2006

(65) Prior Publication Data
US 2007/0228881 A1 Oct. 4, 2007

(30) Foreign Application Priority Data
Mar. 29, 2006 (JP) .............................. 2006-091872

(51) Int. Cl.
*H01L 41/08* (2006.01)
*H01L 41/053* (2006.01)
*H02N 2/00* (2006.01)
(52) U.S. Cl. ...................................... 310/328; 310/352
(58) Field of Classification Search ........... 310/323.17, 310/328, 348, 352
See application file for complete search history.

(56) References Cited

U.S. PATENT DOCUMENTS

| 6,239,534 | B1 * | 5/2001 | Takeuchi et al. ............ 310/328 |
| 6,617,763 | B2 * | 9/2003 | Mita et al. ................... 310/328 |
| 2003/0001457 | A1 * | 1/2003 | Wang et al. ................. 310/328 |
| 2007/0170817 | A1 * | 7/2007 | Ikeda et al. ............ 310/323.04 |

FOREIGN PATENT DOCUMENTS

| JP | 2001-327178 | 11/2001 |
| JP | 2003-228928 | 8/2003 |
| JP | 2003-284362 | 10/2003 |

* cited by examiner

*Primary Examiner*—Thomas M. Dougherty
(74) *Attorney, Agent, or Firm*—Greer, Burns & Crain, Ltd.

(57) ABSTRACT

A micro displacement mechanism minutely displaces an object to be driven. The micro displacement mechanism includes a stationary part and an actuator fixed to the stationary part so as to rotatably support the object to be driven. The actuator includes a pair of piezoelectric actuators attached to opposite side surfaces of said object to be driven, respectively. The pair of piezoelectric actuators are arranged at point symmetric positions with respect to a center of gravity of the object to be driven.

11 Claims, 9 Drawing Sheets

FIG.5
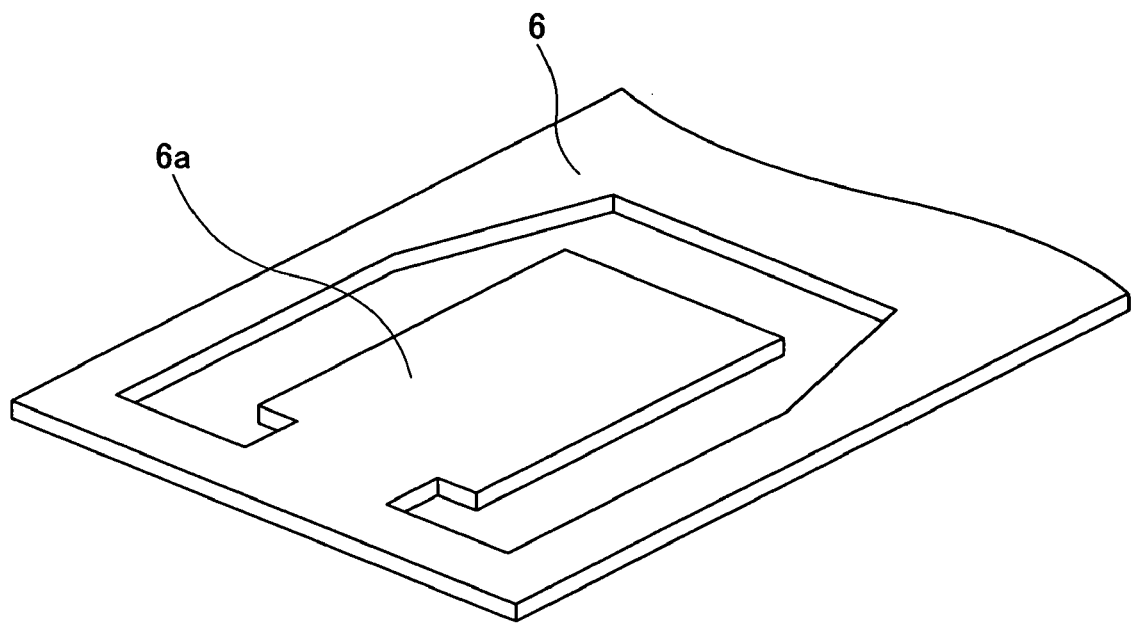
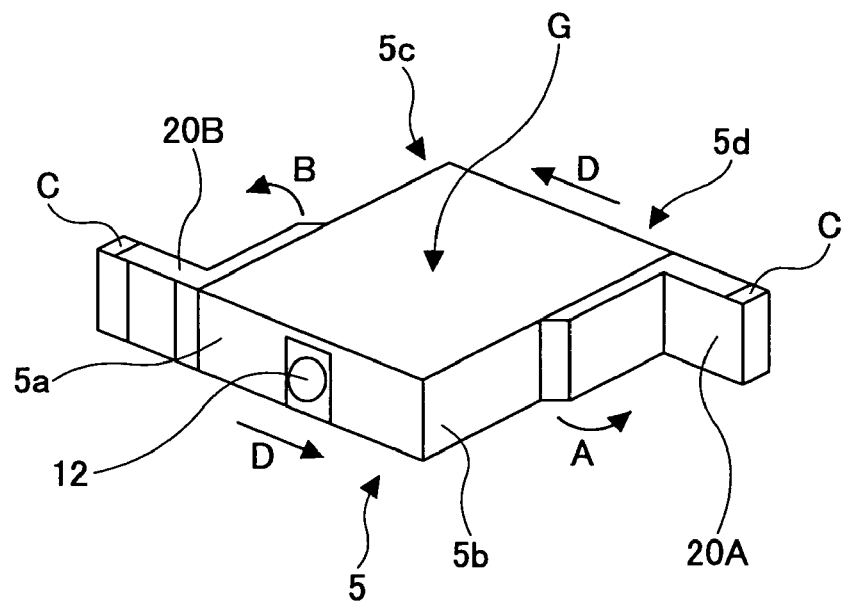

MICRO DISPLACEMENT MECHANISM AND MAGNETIC DISK APPARATUS

BACKGROUND OF THE INVENTION

1. Field of the Invention

The present invention generally relates to micro displacement mechanisms and, more particularly, to a micro displacement mechanism using a piezoelectric actuator and a magnetic disk apparatus, which causes a magnetic head to be minutely displaced by using such a micro displacement mechanism.

2. Description of the Related Art

With progress in miniaturization and precision of information equipments, a demand is increasing for an actuator, which can realize a micro displacement or movement with high accuracy. For example, a micro actuator, which can control a movement of a minute distance, has been required for a head actuator of an inkjet printer or a magnetic disk apparatus.

On the other hand, in a magnetic disk apparatus, with expansion of the market and high-performance of an apparatus, an increase in a recording capacity has become important more and more. Generally, a high-capacity magnetic disk apparatus can be achieved by increasing a memory capacity per disk. In order to achieve a high-density recording without changing a size of a disk, that is, a diameter of a disk, it is necessary to increase a number of tracks (TPI) per unit length, that is, reducing a width of a track. Thus, it is necessary to increase a position accuracy of a head in a direction of a track width, and it is desirous to develop a micro actuator for a magnetic head, which is capable of performing positioning with high accuracy.

A coerce actuator in a fixed part of a suspension holding a head (slider) has been used for conventional head positioning. Conventionally, such a method sufficiently covers recording density of a medium. However, due to high-densification of recording density associated with an increase in a capacity of a recording apparatus, the conventional method has become insufficient in positioning accuracy of a head, and there may occur a read or write error of a head.

Thus, as measures for improving a positioning accuracy of a head, there is suggested a structure in which a micro actuator, which directly displaces a slider, is arranged between the slider and a suspension (for example, refer to Patent Documents 1 and 2). The micro actuator is capable of displacing a head attached to an extreme end of an arm independently of an action of a coerce actuator.

Patent Document 1: Japanese Laid-Open Patent Application No. 2001-327178

Patent Document 2: Japanese Laid-Open Patent Application No. 2003-284362

The micro-actuators disclosed in the above-mentioned Patent Documents 1 and 2 have a structure in which a piezoelectric actuator is disposed between a slider and a suspension so as to minutely displace the slider relative to the suspension. In this structure, a thickness of the slider part is increased due to a portion corresponding to the actuator. Accordingly, when this structure is applied to a magnetic disk apparatus having a plurality of disks in a stacked state, an additional space is required between the magnetic disks since the piezoelectric actuator and the slider are disposed between the adjacent magnetic disks. Thus, there is a problem in that the thickness of the magnetic disk apparatus is increased or a number of disks in the magnetic disk apparatus is limited.

SUMMARY OF THE INVENTION

It is a general object of the present invention to provide an improved and useful micro displacement mechanism in which the above-mentioned problems are eliminated.

A more specific object of the present invention is to provide a micro displacement mechanism which can efficiently displace an object to be driven with good accuracy without providing an actuator between the object to be driven and a stationary part, and a magnetic disk apparatus having such a micro displacement mechanism.

In order to achieve the above-mentioned objects, there is provided according to one aspect of the present invention a micro displacement mechanism for minutely displaces an object to be driven, comprising: a stationary part; and an actuator fixed to the stationary part so as to rotatably support the object to be driven, wherein the actuator includes a pair of piezoelectric actuators attached to opposite side surfaces of the object to be driven, respectively, and the pair of piezoelectric actuators are arranged at point symmetric positions with respect to a center of gravity of the object to be driven.

According to the present invention, the actuator is attached point-symmetrically to the side surfaces of the object to be driven, and, thus, there is no need to locate the actuator between the stationary part and the object to be driven. Accordingly, a thickness of the micro displacement mechanism does not exceed a thickness of the object to be driven, and does not increase a thickness of an apparatus using the micro displacement mechanism. Additionally, since the actuator is attached point-symmetrically to the side surfaces of the object to be driven so as to rotate the object to be driven about the center of gravity, there is no shift of the center of gravity when the object to be driven is minutely displaced, thereby suppressing generation of vibration caused by a minute displacement of the object to be driven.

In the micro displacement mechanism according to the present invention, each of the piezoelectric actuators may be made of a strip-shaped piezoelectric actuator having one end fixed to the side surface of the object to be driven and the other end fixed to the stationary part.

In the micro displacement mechanism according to the present invention, each of the piezoelectric actuators may have a strip-shaped member and a strip-shaped piezoelectric element adhered to the strip-shaped member. Additionally, the strip-shaped piezoelectric element may include at least two active layers consisting of electrode-piezoelectric material-electrode, and the strip-shaped member may be made of zirconia.

Additionally, in the micro displacement mechanism according to the present invention, each of the piezoelectric actuators may be made of an L-shaped piezoelectric actuator having one end fixed to the side surface of the object to be driven and the other end fixed to the stationary part. Additionally, each of the L-shaped piezoelectric actuators may have an L-shaped member and piezoelectric elements adhered to each of two portions of the L-shaped member extending perpendicular to each other, respectively. Further, the piezoelectric elements may be adhered to opposite side surfaces of each of the two portions, respectively. Each of the piezoelectric elements may includes at least two active layers consisting of electrode-piezoelectric material-electrode, and each of the L-shaped members is made of zirconia.

Additionally, in the micro displacement mechanism according to the present invention, the actuator may further include another pair of piezoelectric actuators attached to the opposite side surfaces of the object to be driven, respectively, and the another pair of piezoelectric actuators are arranged at point symmetric positions with respect to the center of gravity of the object to be driven. Each of the piezoelectric actuators may be made of an L-shaped piezoelectric actuator having one end fixed to the side surface of the object to be driven and the other end fixed to the stationary part, and the L-shaped piezoelectric actuator may have an L-shaped member and piezoelectric elements adhered to opposite side surfaces of each of two portions of the L-shaped member extending perpendicular to each other, respectively. Each of the piezoelectric elements may include at least two active layers consisting of electrode-piezoelectric material-electrode, and each of the L-shaped members is made of zirconia.

Additionally, there is provided according to another aspect of the present invention a magnetic disk apparatus comprising: a slider having a magnetic head; a suspension supporting the slider; and a micro displacement mechanism that displaces the slider, wherein the micro displacement mechanism includes an actuator fixed to the suspension and ratatably supporting the slider; the actuator includes a pair of piezoelectric actuators attached to opposite side surfaces of the slider; and the pair of piezoelectric actuators are arranged at point symmetric positions with respect to a center of gravity of the slider.

Other objects features and advantages of the present invention will become more apparent from the following detailed description when read in conjunction with the accompanying drawings.

BRIEF DESCRIPTION OF THE DRAWINGS

FIG. 5 is an exploded perspective view of a micro displacement mechanism according to a second embodiment of the present invention;

DETAILED DESCRIPTION OF THE PREFERRED EMBODIMENTS

Figure 1:
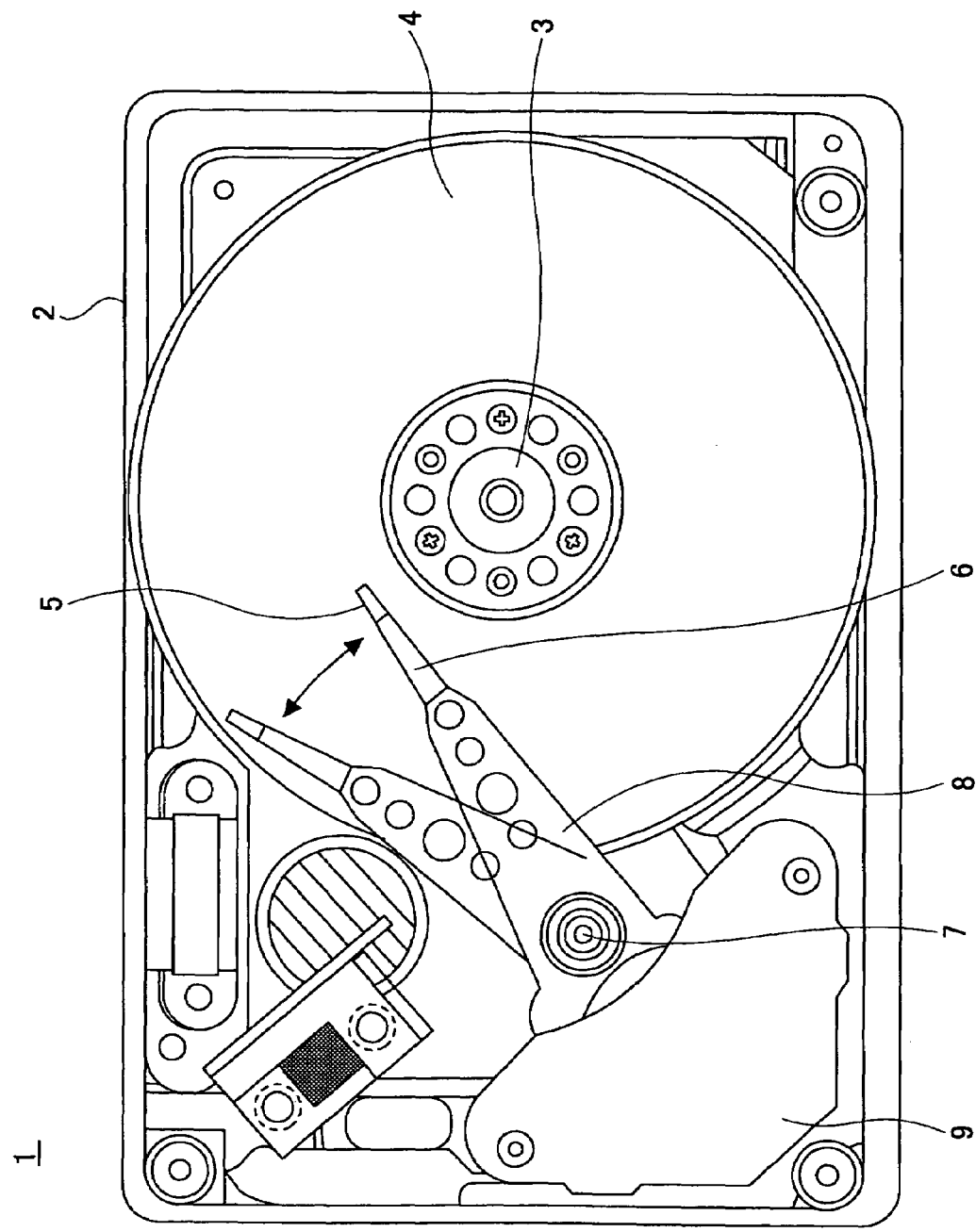
FIG. 1 is a plan view showing an interior of a magnetic disk apparatus according to the present invention.

A description will now be given of a magnetic disk apparatus, which minutely displaces a magnetic head by a micro displacement mechanism using a piezoelectric actuator. FIG. 1 is a plan view showing an interior of a magnetic disk apparatus according to the present invention.

The magnetic disk apparatus 1 shown in FIG. 1 is a hard disk drive (HDD), and has a housing 2 as an outer cover. Provided in the housing 2 are a rotatable magnetic disk 4 attached to a rotational shaft 3, a slider 5 on which a magnetic head is mounted to perform information recording and information reproduction with respect to the magnetic disk 4, a suspension 6 retaining the slider 5, a carriage arm 8 to which the suspension is fixed and movable along a surface of the magnetic disk 4 about an arm shaft 7, and an electromagnetic actuator 9 driving the carriage arm 8. It should be noted that a cover (not shown in the figure) is attached to the housing 2 so that the above-mentioned components parts are accommodated in an inner space formed by the housing 2 and the cover.

When recording information on the magnetic disk 4 or reproducing information recorded on the magnetic disk 4, the carriage arm 8 is driven by the electromagnetic actuator 9, which comprises a magnetic circuit, so as to position the magnetic head at a desired track on the rotating magnetic disk 4. At this time, the magnetic head can be positioned accurately at the desired track on the rotating magnetic disk 4 by minutely displacing the slider 5 by a micro displacement mechanism provided on a distal end of the suspension 6. The magnetic head mounted on the slider 5 sequentially approaches minute areas on each track of the magnetic disk 4 with the rotation of the magnetic disk 4.

When recording information, an electric recording signal is input to the magnetic head, which is proximate to the magnetic disk 4. The magnetic head applies a magnetic field to each minute area in response to the recording signal so as to record information carried by the recording signal as a direction of magnetization of each minute area. When reproducing information, the information recorded in each minute area is taken as an electric reproduction signal in response to the magnetization of each minute area.

Figure 2:
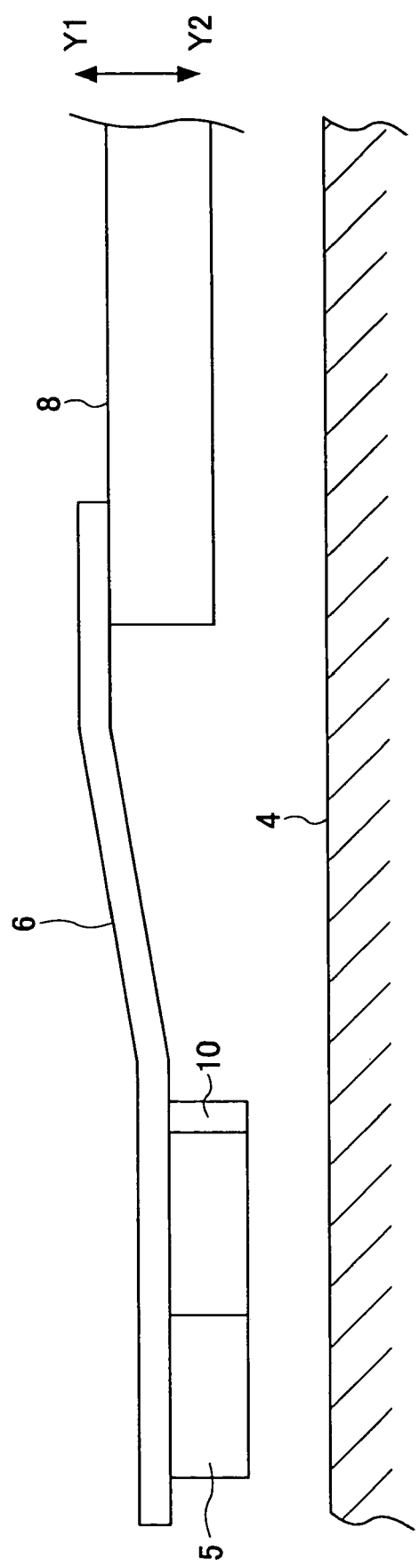
FIG. 2 is a side view of a slider and a distal end portion of a suspension shown in FIG. 1.

FIG. 2 is a side view of the slider and the suspension shown in FIG. 1. In FIG. 2, a distal end portion of the carriage arm 8 shown in FIG. 1 is shown, and the suspension 6 is fixed to the distal end portion of the carriage arm 8 as mentioned above. The suspension 6 functions as a leaf spring, which bends in directions (Y1 and Y2 directions in FIG. 2) in which the suspension 6 approaches and separates from the magnetic disk 4. The slider 5 having the magnetic head is attached to the suspension 6 via the piezoelectric actuator 10. It should be noted that the piezoelectric actuator 10 rotatably supports the slider 5 by being attached to each of opposite side surfaces of the slider 5 and fixed to the suspension 6. The piezoelectric actuator 10 minutely displaces the magnetic head by driving the slider 5 independently from the electromagnetic actuator 9 shown in FIG. 1. The magnetic head is accurately positioned with respect to the magnetic disk 4 by minutely displacing the slider 5 by the piezoelectric actuator 10.

Figure 3:
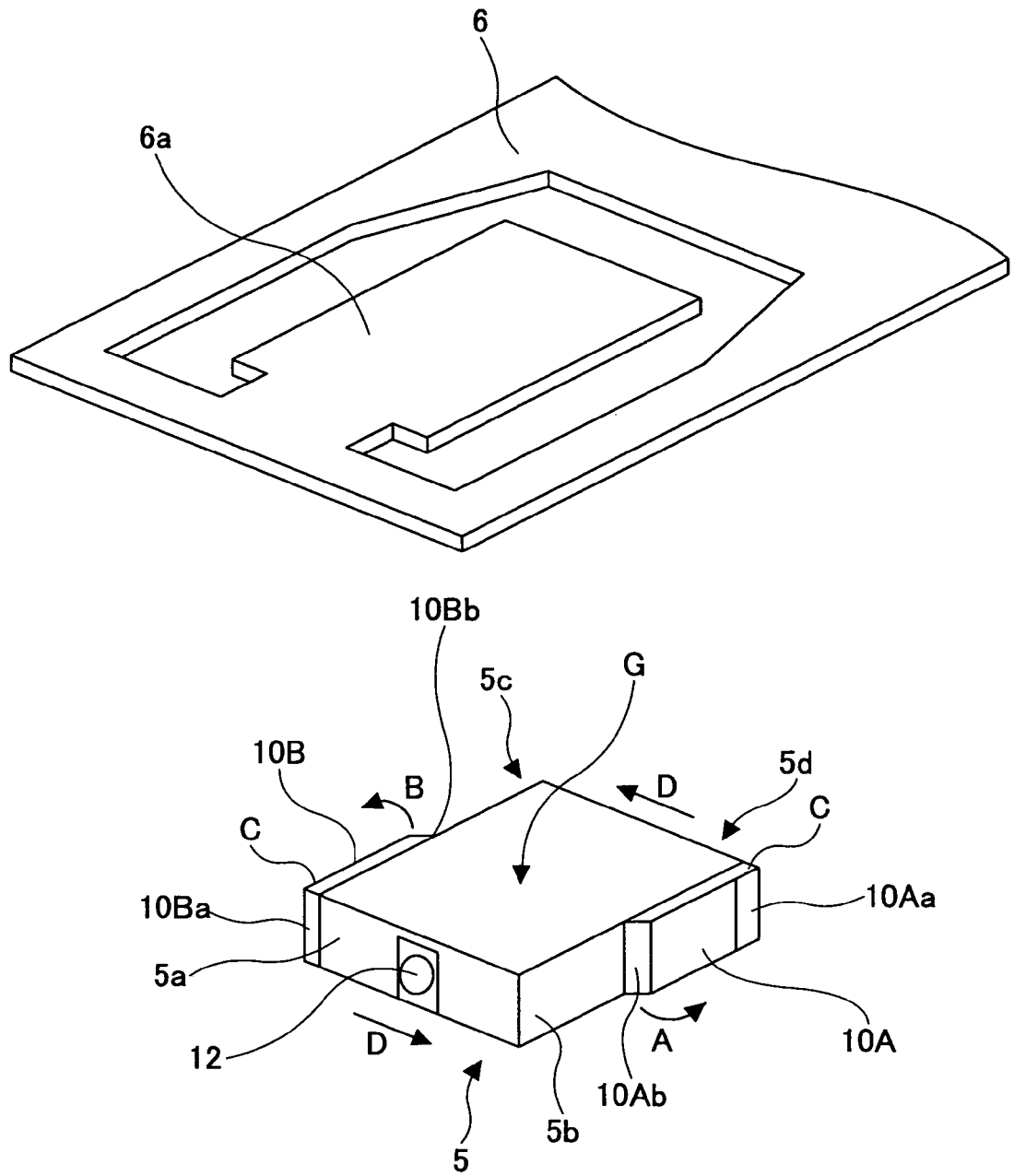
FIG. 3 is an exploded perspective view of a micro displacement mechanism according to a first embodiment of the present invention.

FIG. 3 is an exploded perspective view of the piezoelectric actuator and the distal end portion of the suspension, which constitute a micro displacement mechanism according to a first embodiment of the present invention.

The slider 5 as a member to be driven, which is displaced minutely, is a relatively flat rectangular parallelepiped, and the magnetic head 12 is formed in a center portion of one side surface 5a (hereinafter, referred to as a front surface 5a). A piezoelectric actuator 10A is fixed to a side surface 5b, which extends from one end of the front surface 5a. The piezoelectric actuator 10A is a piezoelectric unimorph-type actuator formed in a strip-like shape having a width substantially equal to a thickness of the slider 5, and is bent in a direction indicated by an arrow A in the figure when a voltage is applied thereto. Additionally, a piezoelectric actuator 10B is fixed to a side surface 5c, which extends from the other end of the front surface 5a. Similar to the piezoelectric actuator 10A, the piezoelectric actuator 10B is a piezoelectric unimorph-type actuator formed in a strip-like shape having a width substantially equal to a thickness of the slider 5, and is bent in a direction indicated by an arrow B in the figure when a voltage is applied thereto.

The piezoelectric actuator 10A extends along the side surface 5b of the slider 5 to a portion of the side surface 5b closer to the front surface 5a than the center of the side surface 5b in a state where an end portion 10Aa of the piezoelectric actuator 10A aligns with a rear surface 5d of the slider 5 opposite to the front surface 5a. An end portion 10Ab of the piezoelectric actuator 10A on the side of the front surface 5a is fixed to the side surface 5b of the slider 5 by an adhesive. That is, the piezoelectric actuator 10A is fixed to the slider 5 by the adhesive only at a portion near the end portion 10Ab, and an unfixed portion can be separated from the side surface 5b of the slider 5 when the piezoelectric actuator 10A is bent. Additionally, only a portion near the end portion 10Aa of the piezoelectric actuator 10A on the side of the rear surface 5d is fixed to a gimbal portion 6a of the suspension 6 via an adhesive. In FIG. 3, the portion fixed to the gimbal portion 6a via the adhesive is indicated by C.

The piezoelectric actuator 10B extends along the side surface 5c of the slider 5 to a portion of the side surface 5c closer to the rear surface 5d than the center of the side surface 5c in a state where an end portion 10Ba of the piezoelectric actuator 10B aligns with the front surface 5a of the slider 5. An end portion 10Bb of the piezoelectric actuator 10B on the side of the rear surface 5d is fixed to the side surface 5c of the slider 5 by an adhesive. That is, the piezoelectric actuator 10B is fixed to the slider 5 by the adhesive only at a portion near the end portion 10Bb, and an unfixed portion can be separated from the side surface 5c of the slider 5 when the piezoelectric actuator 10B is bent. Additionally, only a portion near the end portion 10Ba of the piezoelectric actuator 10B on the side of the front surface 5a is fixed to the gimbal portion 6a of the suspension 6 via an adhesive. In FIG. 3, the portion fixed to the gimbal portion 6a via the adhesive is indicated by C.

The slider 5 is formed of a substantially uniform material, and the center of gravity thereof is at a center position of the flat shape (a point indicated by G in FIG. 3). Accordingly, the piezoelectric actuators 10A and 10B are arranged at point symmetric positions with respect to the position of the center of gravity of the slider 5.

Figure 4:
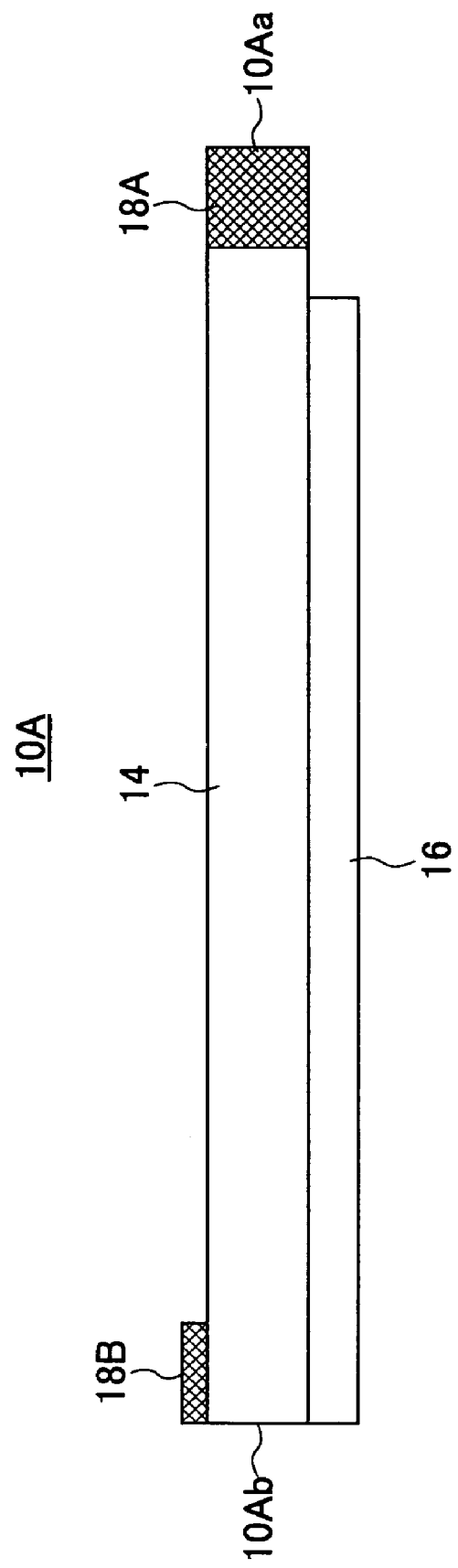
FIG. 4 is a plan view of a piezoelectric actuator shown in FIG. 3 when viewed from a suspension side.

FIG. 4 is a plan view of the piezoelectric actuator 10A viewed from the suspension 6 side. The piezoelectric actuator 10A comprises a strip-shaped member 14 formed of ceramics such as zirconia or alumina and a piezoelectric element 16 firmly fixed to one side surface of the strip-shaped member 14.

Although the strip-shaped member 14 is made of ceramics, it can be elastically curved slightly. Accordingly, the strip-shaped member 14 is curved so that the piezoelectric element 16 is on an inner side when the piezoelectric element 16, which is fixed to the one side surface of the strip-shaped member 14, contracts. This state corresponds to an actuated state of the piezoelectric actuator 10A. When the contraction of the piezoelectric element 16 is cancelled, the strip-shaped member 14 returns to the original flat shape. Additionally, depending on the material of the piezoelectric element 16, the piezoelectric element 16 extends when a reverse voltage is applied thereto. Thus, the piezoelectric actuator 10A can also be curved so that the piezoelectric element 16 is on an outer side.

In FIG. 4, a state where adhesives 18A and 18B are applied to the strip-shaped member 14 is shown. The adhesive 18A is an adhesive for fixing the piezoelectric actuator 10A to the gimbal portion 6a, and the adhesive 18B is an adhesive for fixing the piezoelectric actuator 10A to the slider 5.

Although zirconia is used for the strip-shaped member 14 according to the present invention as a material having a relatively high ductility and easily bendable from among ceramics having stable physicality, other ceramics such as alumina may be used. Further, a stainless steel may be used for the strip-shaped member 14. Although PNN-PT-PZ is used as piezoelectric material ceramics and platinum (Pt) is used as an electrode material in the piezoelectric element 16 according to the present embodiment, PZT, which is a more conventional piezoelectric material, may be used. Additionally, the electrode material is not limited to platinum (Pt), and other appropriate materials may be used, if necessary.

The piezoelectric element 16 according to the present embodiment can be formed by stacking a desired number of sheets, each of which includes a PNN-PT-PZ ceramics green sheet and a Pt electrode paste screen-printed on the green sheet, and sintering the stacked material at a temperature of 1050° C. The thus-sintered stacked material is cut into a predetermined width and length and the piezoelectric elements 16 are formed. Alternatively, the piezoelectric element 16 may be formed by applying a piezoelectric ceramics paste and an electrode paste on the strip-shaped member 14 by printing method and sintering the pastes.

It should be noted that the piezoelectric element may be formed according to other methods such as a sol-gel process or a sputter process.

It should be noted that the piezoelectric actuator 10B has the same structure as the piezoelectric actuator 10A except that an adhesive part for fixing to the gimbal portion 6a is different.

The micro displacement mechanism according to the present invention comprises the slider 5, which is a member to be driven, the piezoelectric actuators 10A and 10B, and the gimbal portion 6a, which is a stationary part. Additionally, the structure for fixing the piezoelectric actuators 10A and 10B, the slider 5 and the gimbal portion 6a to each other is included in the micro displacement mechanism.

In the micro displacement mechanism according to the present embodiment, when predetermined drive voltages are applied to the piezoelectric actuators 10A and 10B, the piezoelectric actuator 10A tends to curve in a direction of an arrow A and the piezoelectric actuator 10b tends to curve in a direction of an arrow B. The end portion 10Aa of the piezoelectric actuator 10A and the end portion 10Ba of the piezoelectric actuator 10B cannot be displaced since they are fixed and bound to the gimbal portion 6a. Thereby, the piezoelectric actuators 10A and 10B curve so that the end portion 10Ab and 10Bb are displaced, respectively. However, the end portion 10Ab and the end portion 10Bb are fixed to the slider 5 and a distance (interval) therebetween cannot be changed. Accordingly, in order for the piezoelectric actuator 10A and the piezoelectric actuator 10B to curve without changing the relative positions (interval) of the end portion 10Ab and the end portion 10Bb, the end portion 10Ab and the end portion 10Bb rotate by a minute angle. Since the piezoelectric actuators 10A and 10B are arranged at point-symmetrical positions with respect to the position of the center of gravity of the slider 5, the end portion 10Ab and the end portion 10Bb slightly rotate about the position of the center of gravity of the slider 5. That is, the slider 5 rotates about the position of the center of gravity thereof.

When the slider 5 rotates about the position of the center of gravity thereof, as shown in the FIG. 3, the magnetic head 12 provided to the front surface 5a is displaced in a direction of an arrow D in accordance with the rotation of the slider 5 as shown in FIG. 3. Thereby, the magnetic head 12 can be displaced minutely. An amount of displacement of the magnetic head 12 can be controlled by changing the voltages applied to the piezoelectric actuators 10A and 10B.

Moreover, if the piezoelectric element 16 is formed of a magnetically hard material, which is difficult to be polarized, so that both contraction and extension can be achieved, the piezoelectric actuators 10A and 10B can be bent in both directions, thereby permitting the slider 5 to rotate minutely in both directions.

As the micro displacement mechanism according to the present embodiment, the slider 5 was configured as a pico-slider having a flat shape of 1 mm×1.25 mm and a thickness of 250-300 μm and a length of each of the piezoelectric actuators 10A and 10B was set to 0.7 mm, and a simulation was performed. As a result, it was confirmed that, when a drive voltage of 45 V was applied to each of the piezoelectric actuators 10A and 10B, the slider 5 was rotationally displaced about the center of gravity thereof and an amount of displacement of the front surface 5a of the slider 5 was 125 nm in a radial direction of a magnetic disk.

Figure 6:
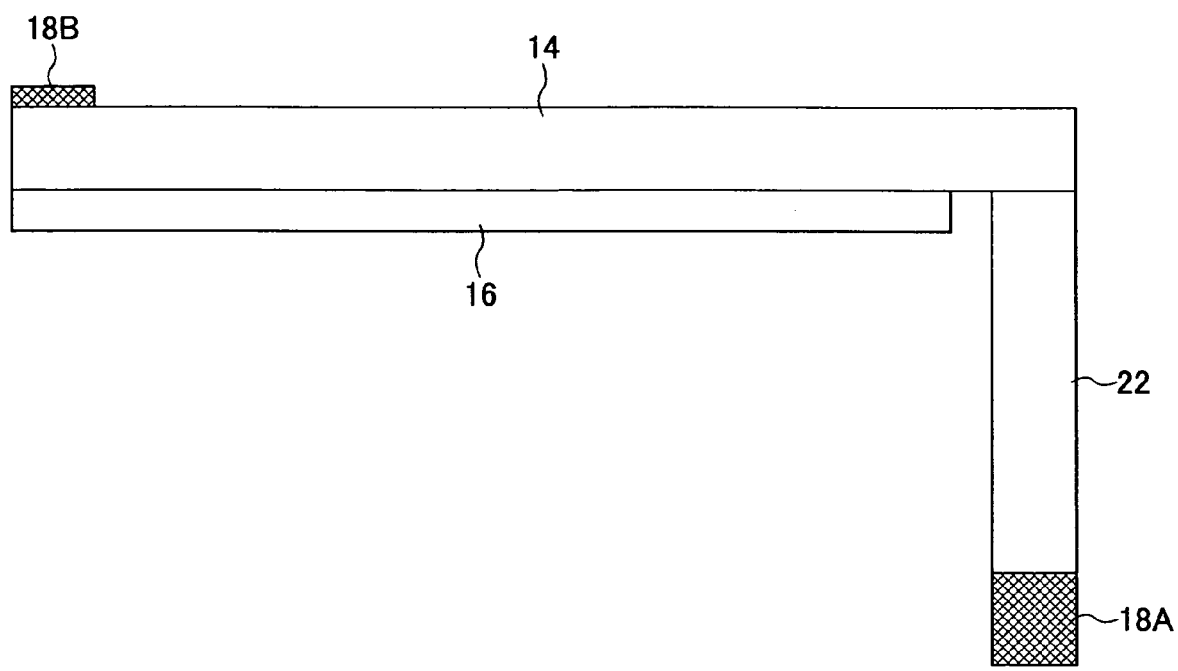
FIG. 6 is a plan view of a piezoelectric actuator shown in FIG. 5 when viewed from a suspension side.

A description will now be given, with reference to FIG. 5 and FIG. 6, of a micro displacement mechanism according to a second embodiment of the present invention. FIG. 5 is a perspective view of the micro displacement mechanism according to the second embodiment of the present invention. FIG. 6 is a plan view of a piezoelectric actuator shown in FIG. 5 viewed from a suspension side. In FIG. 5 and FIG. 6, parts that are the same as the parts shown in FIG. 3 and FIG. 4 are given the same reference numerals, and descriptions thereof will be omitted.

In the present embodiment, the strip-shaped piezoelectric actuators 10A and 10B are changed into L-shaped piezoelectric actuators 20A and 20B, respectively. That is, as shown in FIG. 6, a strip-shaped member 22 is attached to the piezoelectric actuator 10A shown in FIG. 4 so as to form the L-shaped piezoelectric actuator 20A. The strip-shaped member 22 is formed of zirconia, which is the same as the strip-shaped member 14, and is bonded to an end portion opposite to the side adhered to the slider 5. A portion bonded to the gimbal portion 6a is not the strip-shaped member 14 but the strip-shaped member 22. The piezoelectric actuator 20B has the same structure as the piezoelectric actuator 20A, and only the portion bonded to the gimbal portion 6a is different.

It should be noted that although the entire slider 5 including the piezoelectric actuators 20A and 20B attached thereto is shown larger than the gimbal portion 6a in FIG. 5 for the sake of easy recognition of the drawing, the slider 5 including the L-shaped piezoelectric actuators 20A and 20B is a size which falls within the range of the gimbal portion 6a.

According to the present embodiment, when the piezoelectric actuators 20A and 20B are driven, the strip-shaped members 14 are curved and the strip-shaped members 22 to form the L-shape are also curve. Accordingly, the L-shaped piezoelectric actuators 20A and 20B are deformed larger than the piezoelectric actuators 10A and 10B of the above-mentioned first embodiment in which only the straight members 22 are deformed. Thus, the slider 5 supported by the L-shaped piezoelectric actuators 20A and 20B can be displaced greatly.

As the micro displacement mechanism according to the present embodiment, the slider 5 was configured as a pico-slider having a flat shape of 1 mm×1.25 mm and a thickness of 250-300 μm and a length of each of the strip-shaped members 14 of the piezoelectric actuators 20A and 20B was set to 0.7 mm and a length of each of the strip-shaped members 22 was set to 0.35 mm, and a simulation was performed. As a result, it was confirmed that, when a drive voltage of 45 V was applied to each of the piezoelectric actuators 20A and 20B, the slider 5 was rotationally displaced about the center of gravity thereof and an amount of displacement of the front surface 5a of the slider 5 was 396 nm in a radial direction of a magnetic disk. This was three times the amount of displacement acquired in the above-mentioned first embodiment.

Figure 7:
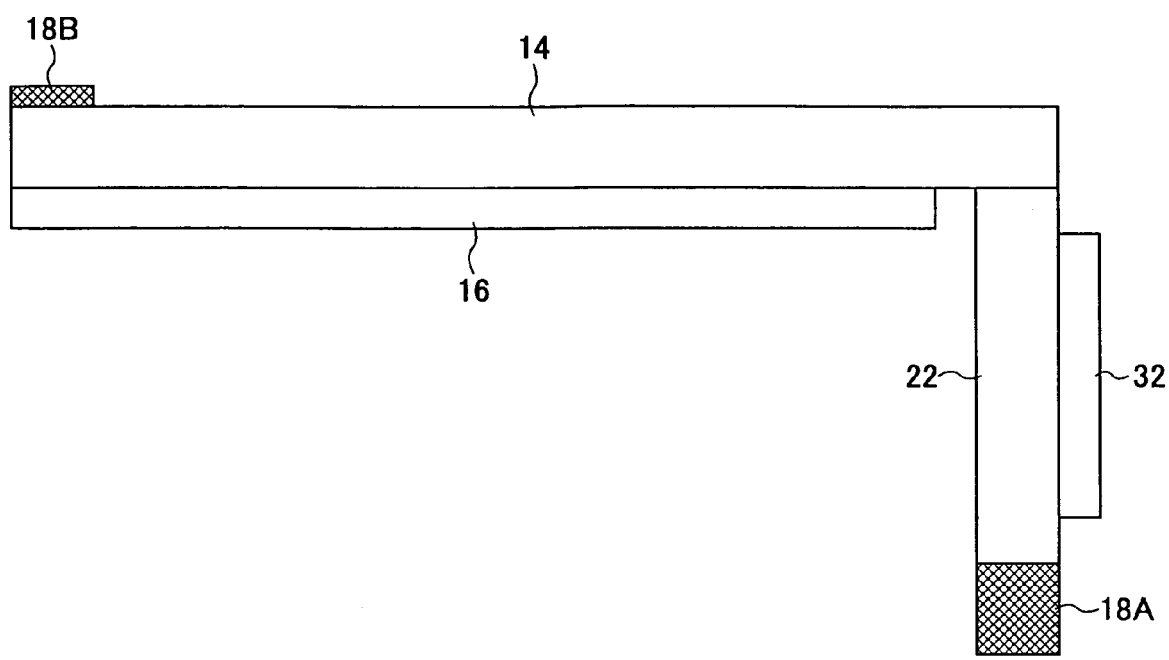
FIG. 7 is a plan view of a piezoelectric actuator used for a micro displacement mechanism according to a third embodiment of the present invention when viewed from the suspension side.

A description will now be given, with reference to FIG. 7, of a micro displacement mechanism according to a third embodiment of the present invention. FIG. 7 is a plan view of a piezoelectric actuator used in the micro displacement mechanism according to the third embodiment of the present invention viewed from a suspension side. In FIG. 7, parts that are the same as the parts shown in FIG. 6 are given the same reference numerals, and descriptions thereof will be omitted.

The micro displacement mechanism according to the third embodiment of the present invention has the same structure as the micro displacement mechanism according to the second embodiment shown in FIG. 5 except that piezoelectric elements are attached to the members 22 of the piezoelectric actuators 20A and 20B so as to form piezoelectric actuators 30A and 30B.

In the piezoelectric actuator 30A, as shown in FIG. 7, a piezoelectric element 32 is fixed to a side surface of the member 22 to form the L-shape. The piezoelectric element 32 is formed in the same manner as the piezoelectric element 16, and an entire surface thereof is bonded to the side surface of the member 22 by an adhesive. It should be noted that, although not shown in the figure, the piezoelectric actuator 30B has the same structure as the piezoelectric actuator 30A except that a portion bonded to the gimbal portion 6a is different.

In the micro displacement mechanism according to the present embodiment, the members 22 are curved, when driving the piezoelectric actuators 30A and 30B, by applying the drive voltage not only to the piezoelectric elements 16 but also to the piezoelectric elements 32. Thereby, the L-shaped piezoelectric actuators 30A and 30B can be deformed greatly.

As the micro displacement mechanism according to the present embodiment, the slider 5 was configured as a pico-slider having a flat shape of 1 mm×1.25 mm and a thickness of 250-300 μm and a length of each of the strip-shaped members 14 of the piezoelectric actuators 30A and 30B was set to 0.7 mm and a length of each of the strip-shaped members 22 was set to 0.35 mm, and a simulation was performed. As a result, it was confirmed that, when a drive voltage of 45 V was applied to each of the piezoelectric actuators 30A and 30B, the slider 5 was rotationally displaced about the center of gravity thereof and an amount of displacement of the front surface 5a of the slider 5 was 427 nm in a radial direction of a magnetic disk. According to the addition of the piezoelectric elements 32 to the strip-shaped members 22, an amount of displacement was larger than the amount of displacement acquired in the above-mentioned second embodiment by 31 nm.

Figure 8:
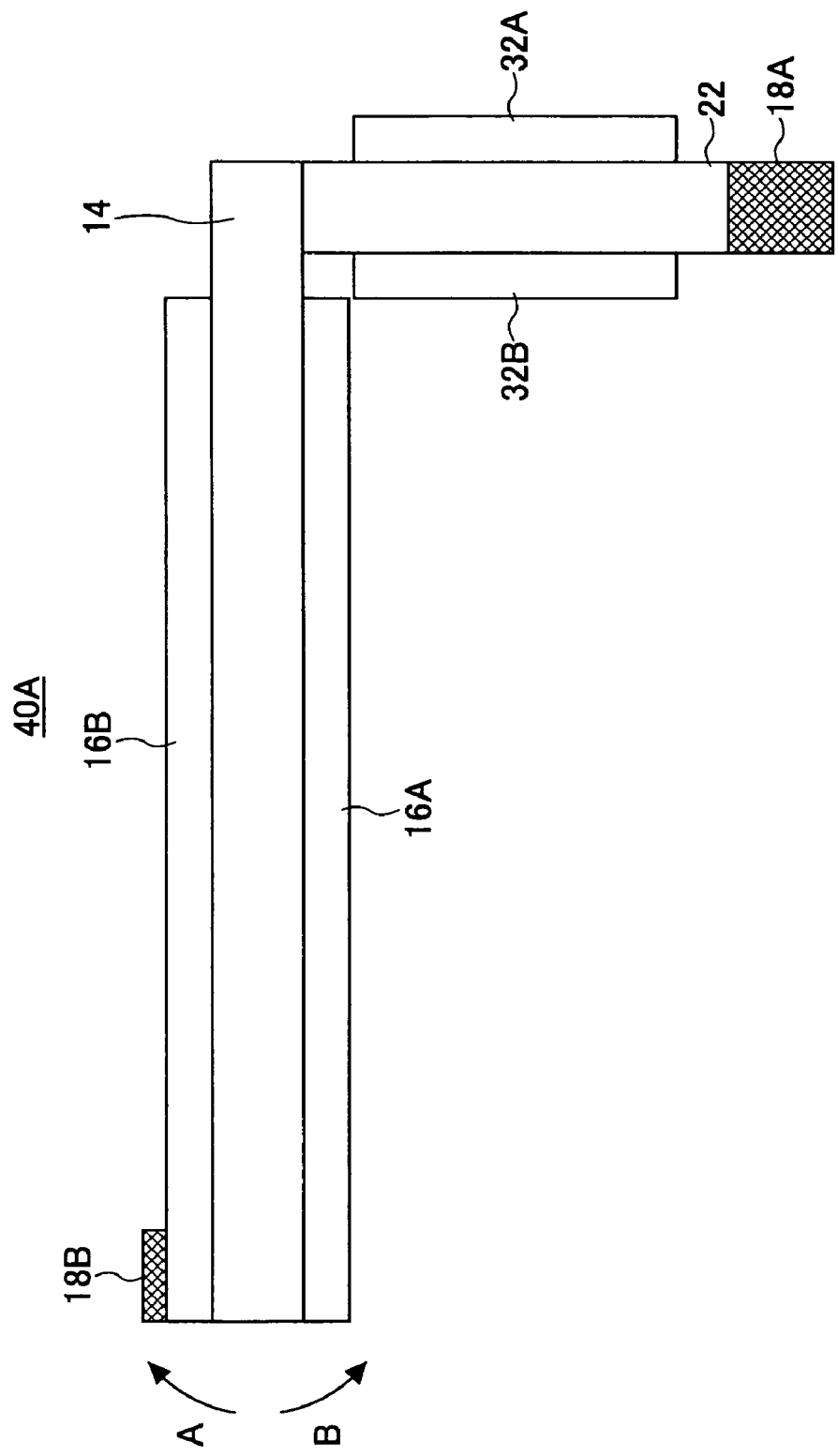
FIG. 8 is a plan view of a piezoelectric actuator used for a micro displacement mechanism according to a fourth embodiment of the present invention when viewed from a suspension side.

A description will now be given, with reference to FIG. 8, of a micro displacement mechanism according to a fourth embodiment of the present invention. FIG. 8 is a plan view of a piezoelectric actuator used in the micro displacement mechanism according to the fourth embodiment of the present invention viewed from a suspension side. In FIG. 8, parts that are the same as the parts shown in FIG. 7 are given the same reference numerals, and descriptions thereof will be omitted.

The micro displacement mechanism according to the fourth embodiment of the present invention has the same structure as the micro displacement mechanism according to the second embodiment shown in FIG. 5 except that, as shown in FIG. 8, piezoelectric elements are attached to opposite side surfaces of the members 14 of the piezoelectric actuators 20A and 20B and also piezoelectric elements are attached to opposite side surfaces of the members 22 so as to form piezoelectric actuators 40A and 40B.

In the piezoelectric actuator 40A, as shown in FIG. 8, the piezoelectric elements 16A and 16B are bonded entirely by an adhesive to the opposite side surface of the strip-shaped member 14, and the piezoelectric elements 32A and 32B are bonded entirely by an adhesive to the opposite side surfaces of the member 22. It should be noted that the piezoelectric actuator 40B has the same structure as the piezoelectric actuator 40A except that a portion bonded to the gimbal portion 6a is different.

In the micro displacement mechanism according to the present embodiment, the drive voltage is applied to the piezoelectric elements 16A and also to the piezoelectric elements 32A when driving the piezoelectric actuators 40A and 40B so as to deform the piezoelectric actuators 40A and 40B in a direction of an arrow A in FIG. 8. On the other hand, the piezoelectric actuators 40A and 40B can be deformed in a direction of an arrow B in FIG. 8 by not driving the piezoelectric element 16B and the piezoelectric element 32A and applying the drive voltage to the piezoelectric element 16B and also to the piezoelectric element 32B. Accordingly, in the micro displacement mechanism according to the present embodiment, the slider 5 can be rotated in a direction (supposed as a counterclockwise direction) indicated by an arrow D in FIG. 5 by applying the drive voltage to the piezoelectric elements 16A and 32A, and the slider 5 can be rotated in a direction (supposed as a clockwise direction) opposite to the direction indicated by the arrow D in FIG. 5 by applying the drive voltage to the piezoelectric elements 16B and 32B.

As the micro displacement mechanism according to the present embodiment, the slider 5 was configured as a picoslider having a flat shape of 1 mm×1.25 mm and a thickness of 250-300 μm and a length of each of the strip-shaped members 14 of the piezoelectric actuators 40A and 40B was set to 0.7 mm and a length of each of the strip-shaped members 22 was set to 0.35 mm, and a simulation was performed. As a result, it was confirmed that, when a drive voltage of 45 V was applied to each of the piezoelectric elements 16A and 32A of the piezoelectric actuators 40A and 40B, the slider 5 was rotationally displaced about the center of gravity thereof in the counterclockwise direction and an amount of displacement of the front surface 5a of the slider 5 was 328 nm in a radial direction of a magnetic disk. Additionally, it was confirmed that when a drive voltage of 45 V was applied to each of the piezoelectric elements 16B and 32B of the piezoelectric actuators 40A and 40B, the slider 5 was rotationally displaced about the center of gravity thereof in the clockwise direction and an amount of displacement of the front surface 5a of the slider 5 was 279 nm in a radial direction of a magnetic disk. It was confirmed that an amount of displacement in one direction is reduced from that of the third embodiment, but an amount of displacement was as much as 328+279=607 nm, which is a sum of the amounts of displacement in both directions.

It should be noted that it was supposed that the reason for the difference between the counterclockwise direction and the clockwise direction is that the rigidity characteristics of the piezoelectric actuators 40A and 40B differ from each other since an angle of the L-shape of each of the piezoelectric actuators 40A and 40B is reduced in the counterclockwise direction but the angle of the L-shape is increased in the clockwise direction.

Figure 9:
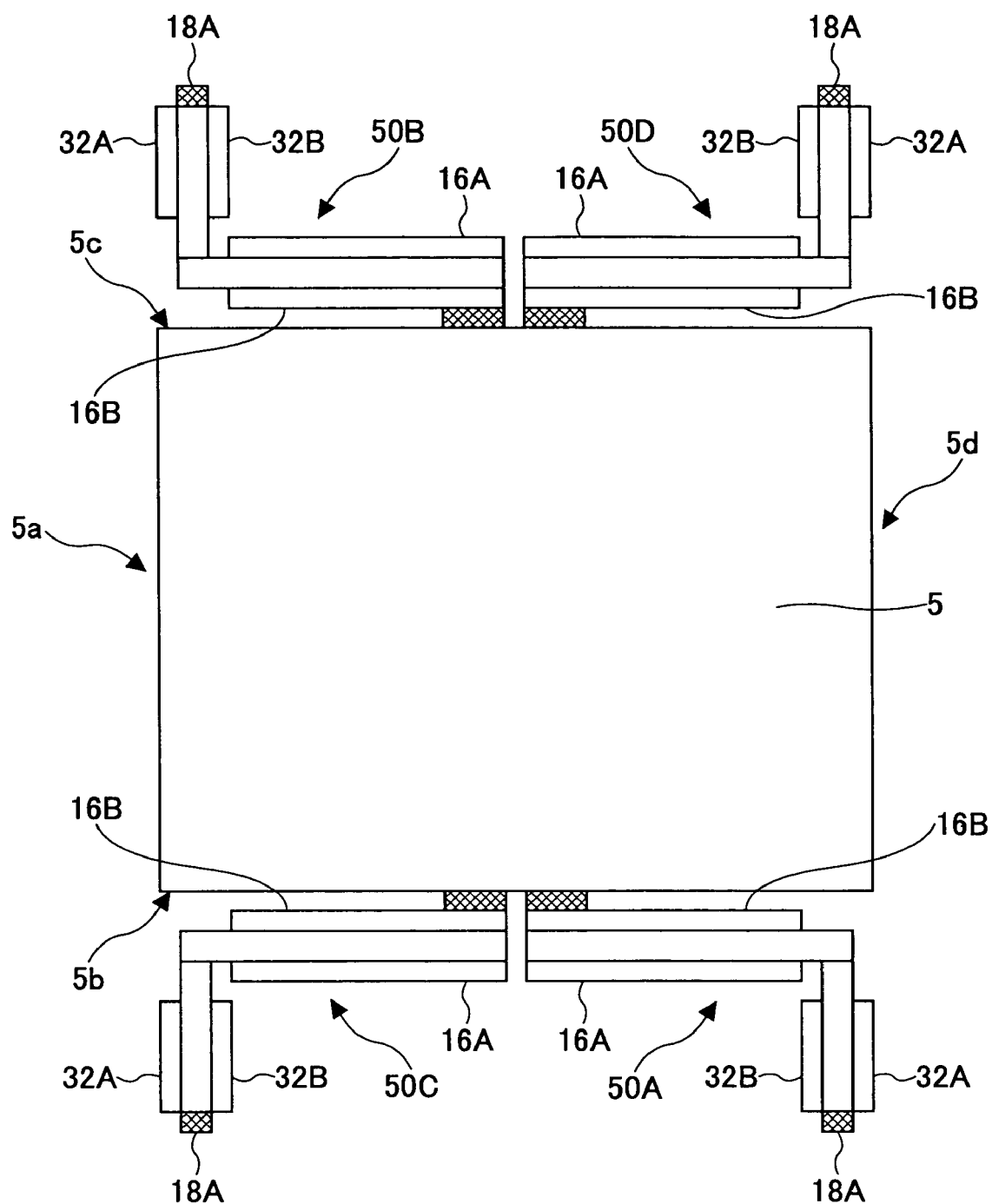
FIG. 9 is a plan view of a piezoelectric actuator used for a micro displacement mechanism according to a fourth embodiment of the present invention when viewed from a suspension side in a state where a slider is supported by the suspension.

A description will now be given, with reference to FIG. 9, of a micro displacement mechanism according to a fifth embodiment of the present invention. FIG. 9 is a plan view of a piezoelectric actuator used in the micro displacement mechanism according to the fifth embodiment of the present invention viewed from a suspension side. In FIG. 9, parts that are the same as the parts shown in FIG. 8 are given the same reference numerals, and descriptions thereof will be omitted.

In the micro displacement mechanism according to the fifth embodiment of the present invention, a total of four L-shaped piezoelectric actuators such as shown in FIG. 8 are attached to opposite sides of the slider, two each on each of the opposite sides. In such a structure, the piezoelectric elements of the piezoelectric actuators 50A, 50B, 50C and 50D are selectively driven so that a direction of displacement by the piezoelectric actuators 50A and 50B is the same as a direction of displacement by the piezoelectric actuators 50C and 50D. For example, when driving the piezoelectric actuators 50A and 50B by applying the drive voltage to the piezoelectric elements 16A and 32A, the piezoelectric actuators 50C and 50D are driven by applying the drive voltage to the piezoelectric elements 16B and 32B.

As the micro displacement mechanism according to the present embodiment, the slider 5 was configured as a picoslider having a flat shape of 1 mm×1.25 mm and a thickness of 250-300 μm and a length of each of the strip-shaped members 14 of the piezoelectric actuators 50A, 50B, 50C and 50D was set to 0.6 mm and a length of each of the strip-shaped members 22 was set to 0.3 mm, and a simulation was performed. As a result, it was confirmed that, when a drive voltage of 45 V was applied to each of the piezoelectric elements 16A and 32A of the piezoelectric actuators 50A and 50B and a drive voltage of 45 V was applied to each of the piezoelectric elements 16B and 32B of the piezoelectric actuators 50C and 50D, the slider 5 was rotationally displaced about the center of gravity thereof in the counterclockwise direction and an amount of displacement of the front surface 5a of the slider 5 was 225 nm in a radial direction of a magnetic disk. Additionally, it was confirmed that when a drive voltage of 45 V was applied to each of the piezoelectric elements 16B and 32B of the piezoelectric actuators 50A and 50B and a drive voltage of 45 V was applied to each of the piezoelectric elements 16A and 32A of the piezoelectric actuators 50C and 50D, the slider 5 was rotationally displaced about the center of gravity thereof in the clockwise direction and an amount of displacement of the front surface 5a of the slider 5 was 225 nm in a radial direction of a magnetic disk. It was confirmed that if the drive voltages are the same, amounts of displacement of the slider 5 are the same in the counterclockwise direction and the clockwise direction.

As mentioned above, according to the above-mentioned embodiments, there is no need to provide the piezoelectric actuators between the gimbal portion 6a and the slider 5 since the piezoelectric actuators are attached to the side surfaces of the slider at point symmetric positions. Accordingly, the thickness of the micro displacement mechanism does not exceed the thickness of the slider, thereby preventing an increase in the thickness of the magnetic disk apparatus using the micro displacement mechanism.

Additionally, by forming the piezoelectric actuator in the L-shape, an amount of rotational displacement of the slider can be increased, and, therefore, a large amount of displacement can be acquired efficiently with a simple and small micro displacement mechanism.

Further, since the actuators are attached to the side surfaces of the slider 5 at point symmetric positions and is rotated about the center of gravity of the slider, there is no movement of the center of gravity when the slider is displaced minutely, which suppresses generation of vibration caused by the minute displacement of the slider.

In the above-mentioned embodiments, although the drive voltage of 45 V is applied to the piezoelectric actuators, a higher voltage being applied may provide a larger displacement. Or, a larger displacement may be obtained by reducing the thickness of the members of the piezoelectric actuator to facilitate bending deformation. Additionally, although PNN-PT-PZ is used as the piezoelectric ceramics in the above-mentioned embodiments, PZT, which is conventionally used as piezoelectric ceramics, may be used. In such a case, the slider can be displaced in a reverse direction without providing piezoelectric elements on opposite sides of the member of the piezoelectric actuator, by providing the piezoelectric element to only one side of the member and reversing the direction of applying the drive voltage.

The present invention is not limited to the specifically disclosed embodiments, and variations and modifications may be made without departing from the scope of the present invention.

The present application is based on Japanese priority application No. 2006-091872 filed Mar. 29, 2006, the entire contents of which are hereby incorporated herein by reference.

What is claimed is:

1. A micro displacement mechanism for minutely displacing an object to be driven, comprising:
   a stationary part; and
   an actuator fixed to the stationary part so as to rotatably support the object to be driven,
   wherein said actuator includes a pair of piezoelectric actuators attached to opposite side surfaces of said object to be driven, respectively, and the pair of piezoelectric actuators are arranged at point symmetric positions with respect to a center of gravity of said object to be driven.

2. The micro displacement mechanism as claimed in claim 1, wherein each of said piezoelectric actuators is made of a strip-shaped piezoelectric actuator having one end fixed to said side surface of said object to be driven and the other end fixed to said stationary part.

3. The micro displacement mechanism as claimed in claim 1, wherein each of said piezoelectric actuators has a strip-shaped member and a strip-shaped piezoelectric element adhered to the strip-shaped member.

4. The micro displacement mechanism as claimed in claim 3, wherein said strip-shaped piezoelectric element includes at least two active layers consisting of electrode-piezoelectric material-electrode, and said strip-shaped member is made of zirconia.

5. The micro displacement mechanism as claimed in claim 1, wherein each of said piezoelectric actuators is made of an L-shaped piezoelectric actuator having one end fixed to said side surface of said object to be driven and the other end fixed to said stationary part.

6. The micro displacement mechanism as claimed in claim 5, wherein each of said L-shaped piezoelectric actuators has an L-shaped member and piezoelectric elements adhered to each of two portions of the L-shaped member extending perpendicular to each other, respectively.

7. The micro displacement mechanism as claimed in claim 6, wherein the piezoelectric elements are adhered to opposite side surfaces of each of said two portions, respectively.

8. The micro displacement mechanism as claimed in claim 5, wherein each of said piezoelectric elements includes at least two active layers consisting of electrode-piezoelectric material-electrode, and each of said L-shaped members is made of zirconia.

9. The micro displacement mechanism as claimed in claim 1, wherein said actuator further includes another pair of piezoelectric actuators attached to said opposite side surfaces of said object to be driven, respectively, and the another pair of piezoelectric actuators are arranged at point symmetric positions with respect to the center of gravity of said object to be driven.

10. The micro displacement mechanism as claimed in claim 9, wherein each of said piezoelectric actuators is made of an L-shaped piezoelectric actuator having one end fixed to said side surface of said object to be driven and the other end fixed to said stationary part, and said L-shaped piezoelectric actuator has an L-shaped member and piezoelectric elements adhered to opposite side surfaces of each of two portions of the L-shaped member extending perpendicular to each other, respectively.

11. The micro displacement mechanism as claimed in claim 10, wherein each of said piezoelectric elements includes at least two active layers consisting of electrode-piezoelectric material-electrode, and each of said L-shaped members is made of zirconia.

* * * * *